(12) United States Patent
Schreck et al.

(10) Patent No.: US 11,404,116 B2
(45) Date of Patent: Aug. 2, 2022

(54) DATA STORAGE BASED ON DATA POLARITY

(71) Applicant: Micron Technology, Inc., Boise, ID (US)

(72) Inventors: John F. Schreck, Lucas, TX (US); George B. Raad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/071,742

(22) Filed: Oct. 15, 2020

(65) Prior Publication Data

US 2021/0090644 A1 Mar. 25, 2021

Related U.S. Application Data

(63) Continuation of application No. 16/459,462, filed on Jul. 1, 2019, now Pat. No. 10,832,768.
(Continued)

(51) Int. Cl.
*G11C 11/00* (2006.01)
*G11C 11/56* (2006.01)
(Continued)

(52) U.S. Cl.
CPC ........ *G11C 11/5642* (2013.01); *G06F 3/0616* (2013.01); *G06F 3/0653* (2013.01);
(Continued)

(58) Field of Classification Search
CPC .......... G06F 13/42; G06F 13/16; G06F 13/40; G06F 9/30; G06F 15/16; G06F 3/06;
(Continued)

(56) References Cited

U.S. PATENT DOCUMENTS 9,450,607 B1 9/2016 Alakuijala et al.
9,691,450 B1 6/2017 Cronie et al.
(Continued)

FOREIGN PATENT DOCUMENTS

JP 2018005967 A 1/2018

OTHER PUBLICATIONS

ISA/KR, International Search Report and Written Opinion of the International Searching Authority, Int'l. Appl. No. PCT/US2019/040299, dated Oct. 25, 2019, Korean Intellectual Property Office, Seo-gu, Daejeon, Republic of Korea, 16 pgs.
(Continued)

*Primary Examiner* — Thong Q Le
(74) *Attorney, Agent, or Firm* — Holland & Hart LLP

(57) ABSTRACT

Methods, systems, and devices for storing and reading data at a memory device are described. A memory device may utilize one or more storage states to store data within a data word. The memory device may exhibit higher data leakage or more power consumption when storing or reading a first storage state compared to storing or reading one or more other storage states. In some cases, the memory device may generate a second data word corresponding to a first data word by modifying each symbol type of the first data word to generate a different symbol type for the second data word. A memory device may reduce the occurrence of a storage state associated with large data leakage, or high-power consumption, or both. Further, the memory device may generate and store an indicator indicating the transformation of a corresponding data word.

20 Claims, 11 Drawing Sheets

Related U.S. Application Data

(60) Provisional application No. 62/693,786, filed on Jul. 3, 2018.

(51) Int. Cl.
| | | |
|---|---|---|
| *G11C 29/42* | (2006.01) | |
| *G06F 3/06* | (2006.01) | |
| *G06F 13/16* | (2006.01) | |

(52) U.S. Cl.
CPC ........ *G06F 3/0674* (2013.01); *G06F 13/1668* (2013.01); *G11C 29/42* (2013.01)

(58) Field of Classification Search
CPC ........ G06F 13/38; G06F 15/82; G06F 16/901; G06F 9/38; G06F 1/14; G06F 1/3234; G06F 12/0806; G06F 12/10; G06F 12/1009; G06F 12/1027; G06F 13/00; G06F 13/24; G06F 13/36; G06F 15/00; G06F 7/53; G06F 9/445; G06F 9/50; G06F 1/00; G06F 12/00; G06F 12/06; G06F 12/0891; G06F 12/1081; G06F 13/20; G06F 15/76; G06F 3/00; G06F 9/00; G06F 9/22; G06F 9/355; G06F 9/46; G06F 9/54; G06F 1/3203; G06F 1/3225; G06F 1/3275; G06F 13/1673; G06F 1/26; G06F 1/32; G11C 11/56; G11C 29/42; G11C 16/06; G11C 5/04; G11C 5/148; H04L 47/10; H04L 47/245; H04L 47/34; H04L 47/365
USPC .... 365/189.02, 189.08, 221, 230.02, 230.05, 365/230.03, 233.14; 711/167, 149, 5, 711/106, 150, 153, 168, 170, 173
See application file for complete search history.

(56) References Cited

U.S. PATENT DOCUMENTS

| | | |
|---|---|---|
| 9,779,803 B1 | 10/2017 | Konigsburg et al. |
| 2014/0207741 A1 | 7/2014 | Morsi et al. |
| 2015/0032982 A1 | 1/2015 | Talagala et al. |
| 2016/0004882 A1 | 1/2016 | Ballai et al. |
| 2017/0308299 A1 | 10/2017 | Cha et al. |
| 2018/0095921 A1* | 4/2018 | Lambrecht .......... G06F 13/4018 |

OTHER PUBLICATIONS

European Patent Office, "Extended Search Report," issued in connection with European Patent Application No. 19830605.2, dated Oct. 22, 2021 (9 pages).

* cited by examiner

DATA STORAGE BASED ON DATA POLARITY

CROSS REFERENCE

The present Applications for Patent a continuation of U.S. patent application Ser. No. 16/459,462 by Schreck et al., entitled "DATA STORAGE BASED ON DATA POLARITY" filed Jul. 1, 2019, which claims priority to U.S. Provisional Patent Application No. 62/693,786 by Schreck et al., entitled "DATA STORAGE BASED ON DATA POLARITY" filed Jul. 3, 2018, assigned to the assignee hereof and each of which is expressly incorporated by reference in its entirety.

BACKGROUND

The following relates generally to a system that includes a memory device and, more specifically to data storage based on data polarity.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices (e.g., a multi-level cell (MLC) device), more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source. Improving memory devices, generally, may include increasing memory cell density, increasing read/write speeds, increasing reliability, increasing data retention, reducing power consumption, or reducing manufacturing costs, among other metrics. Some memory devices may utilize data bus inversion (DBI) to decrease power consumption while communicating data. But DBI may not address increased performance for (e.g., data retention, power consumption) related to data storage.

DETAILED DESCRIPTION

Figure 1:
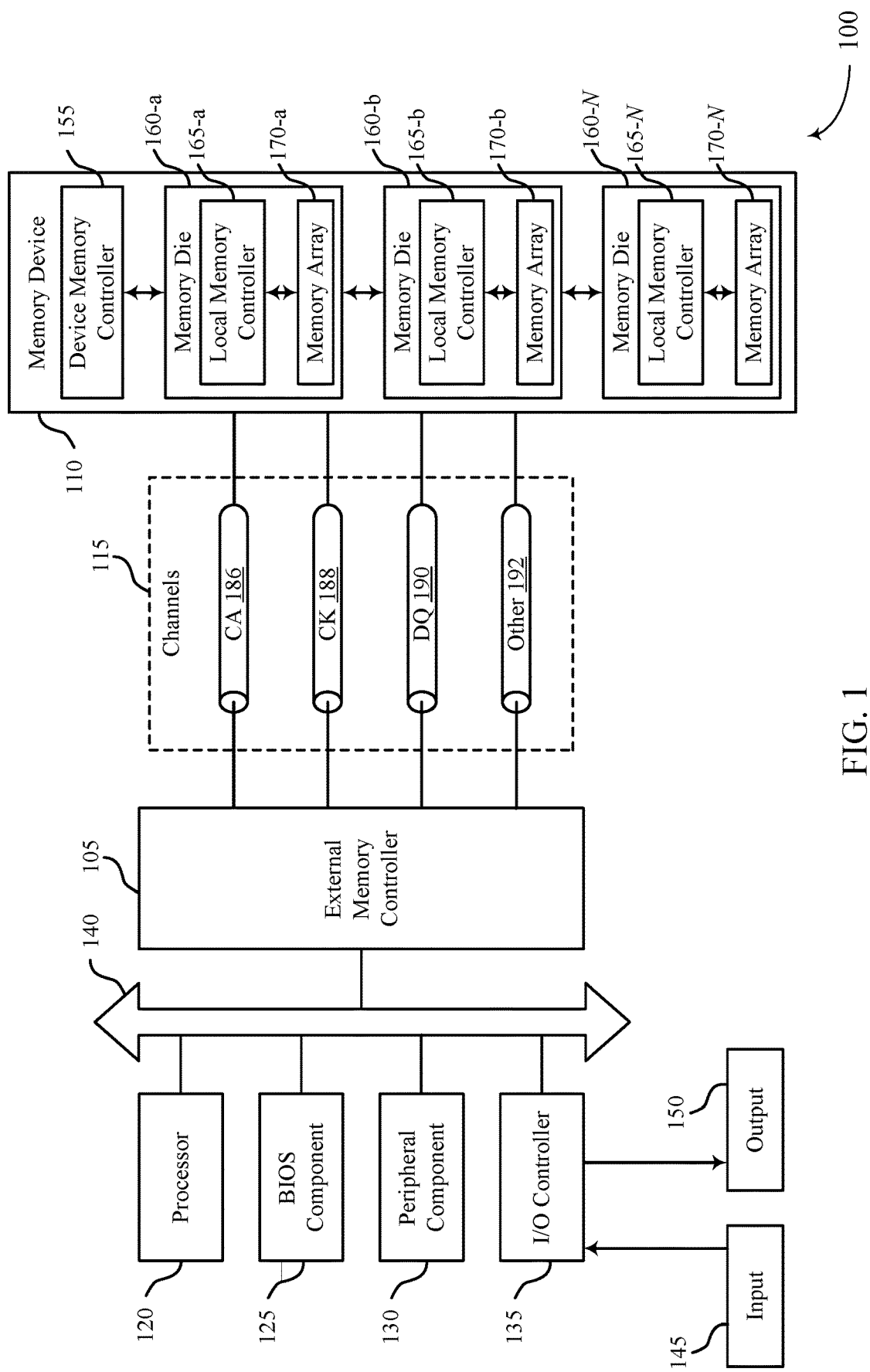
FIG. 1 illustrates an example of a system that supports data storage based on data polarity in accordance with the present disclosure.

In some memory devices (e.g., DRAM memory devices), a memory cell may experience current or charge leakage, which may affect the reliability of data stored in the memory cell and, in turn, the array of which the cell is a component. This may manifest as a decrease in data retention and data integrity such that the memory device may exhibit higher error rates as a result of stored charges leaking off over time. Throughout the disclosure, the term leakage may refer to charge or current leakage, or to the resulting impact on the information or data stored in a cell (e.g., "data leakage"). In some cases, certain storage states (e.g., charge levels) may exhibit higher rates of leakage than other storage states. In other examples, a memory device may utilize higher power consumption when storing one storage state when compared to storing one or more other storage states. That is, the memory device may exhibit poorer performance when storing or reading a first storage state when compared to storing or reading a second storage state. In some cases, reducing the occurrence of the storage stage with large data leakage or power consumption may increase the overall performance of the memory device (e.g., improved data retention, lower power consumption).

In accordance with the disclosure herein, a memory device may transform data before storing the data in one or more memory cells to reduce leakage and thereby improve data retention and/or data integrity. The memory device may receive a first data word to be stored in the memory device. The memory device may determine whether the first data word meets a storage state criterion. For example, the memory device may determine symbol types that may be stored in the memory cells as part of the data word. The memory device may generate a second data word corresponding to the first data word by applying a transformation to the first data word. The transformation may include modifying each symbol type of the first data word to a corresponding symbol type for the second data word. With the transformation, the memory device may reduce the amount of data leakage for storing the first data word and thereby reduce data loss, errors, or other detrimental behavior.

Further, the memory device may generate and store an indicator corresponding to the second data word stored in the memory device. The indicator may indicate that the second data word is a transformed version of the first data word. In this manner, the memory device may reduce the occurrence of symbol types associated with detrimental behavior which may, in turn, increase the performance of the memory device (e.g., increase data retention, power consumption). In some cases, the memory device may include one or more multi-level memory cells that are configured to store three or more states. These transformations can be used to transform multi-level data and reduce data leakage in multi-level memory devices.

Features of the disclosure are initially described in the context of a memory system. Features of the disclosure are described in the context of process flows, an example of a multi-level cell transformation, and device block diagrams. These and other features of the disclosure are further illustrated by and described with reference to apparatus diagrams, system diagrams, and flowcharts that relate to data storage based on data polarity.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, or software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include one or more memory dice 160 (e.g., memory chips) to support a desired or specified capacity for data storage. The memory device 110 including two or more memory dice 160 may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 125 may be other components understood by those skilled in the art as peripherals.

The I/O controller 135 may manage data communication between the processor 120 and the peripheral component(s) 13, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. In some cases, each memory cell may be configured to store more than one bit of digital data (i.e., each memory cell may have three or more types of storage states rather than two). In some cases, certain storage states may exhibit higher rates of leakage than other storage states. Additionally or alternatively, the memory device 110 may utilize more power when storing one type of storage state compared to other types of storage states. In some cases, the memory device 110 may reduce the occurrence of the storage state with large data leakage and/or the storage state associated with high power consumption. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120).

In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110 or at a module (e.g., a dual inline memory module (DIMM)) that includes memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths. In some examples, error correction codes (ECCs) may further be utilized to improve system reliability.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0).

Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
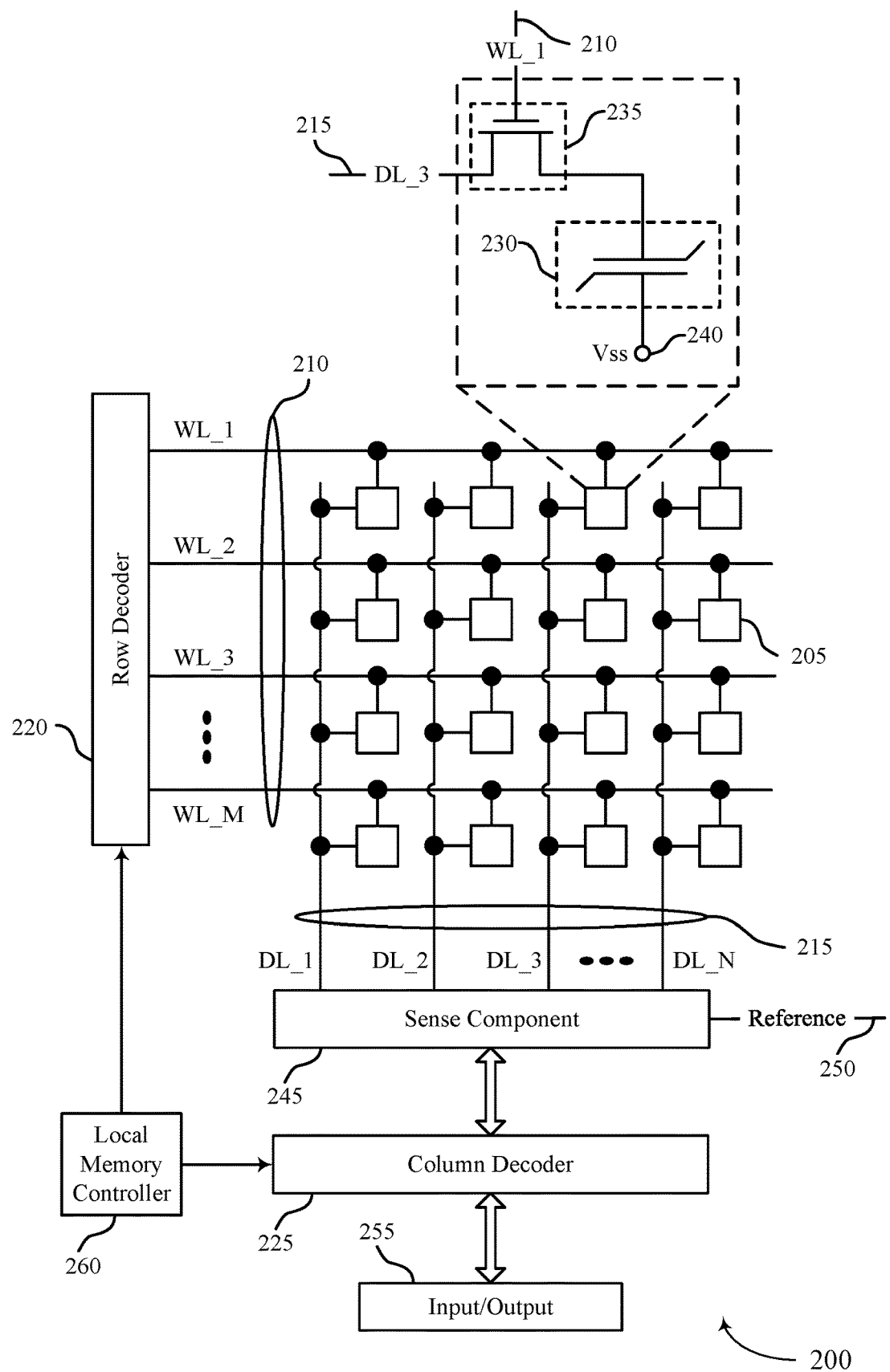
FIG. 2 illustrates an example of a memory array that supports data storage based on data polarity in accordance with the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In some cases, the dielectric material may have various characteristics that enable it to store certain charges with less leakage than other charges.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may arrange the access lines (e.g., the word lines 210 and the digit lines 215) in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220, a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, memory die 200 may include multiple word lines 210, labeled WL_1 through WL M, and multiple digit lines 215, labeled DL_1 through DL N, where M and N depend on the size of the memory die 200. Thus, by activating a word line 210 and a digit line 215, e.g., WL_1 and DL 3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor that is controlled by applying a voltage to a gate of the transistor. When the voltage differential between the transistor gate and transistor source is greater than the voltage threshold of the transistor, the switching component 235 may be activated or deactivate based on being a p-type transistor or an n-type transistor. The word line 210 may be in electronic communication with the gate of the switching component 235 and may activate/deactivate the switching component 235 based on a voltage being applied to word line 210

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect state (e.g., a charge) stored on the capacitor 230 of the memory cell 205 and determine a logic state of the memory cell 205 based on the stored state. A charge stored by a memory cell 205 may be extremely small, in some cases. As such, the sense component 245 may include one or more sense amplifiers to amplify the signal output by the memory cell 205 during a read operation. The sense amplifiers may detect small changes in the charge of a digit line 215 during a read operation and may amplify a signal to a logic state 0 or a logic state 1 based on the detected charge. Alternatively, the memory cell 205 may be a multi-level cell (MLC) capable of storing more than binary information (i.e., memory cell 205 may store three or more types of symbols rather than two). During a read operation, the capacitor 230 of memory cell 205 may output a signal (e.g., discharge a charge to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from a controller 105, translate the commands and/or data into information that can be used by the memory die 200, perform one or more operations on the memory die 200, and communicate data from the memory die 200 to the controller 105 in response to performing the one or more commands. The local memory controller 260 may generate row and column address signals to activate the target word line 210 and the target digit line 215. The local memory controller 260 may also generate and control various voltages or currents used during the operation of memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a logic state. In some cases, certain logic states may exhibit higher rates of leakage than other logic states. In other examples, certain logic states may utilize higher power consumption when being stored than others logic states. In some cases, the local memory controller 260 may be configured to reduce the occurrence of logic states with large data leakage or high-power consumption which may increase the overall performance of memory die 200. The local memory controller 260 may further be configured to generate and store an indicator that indicates whether the stored logic states may be transformed versions of different logic states.

In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state in the capacitor 230 of the memory cell 205, the specific state may be indicative of a desired logic state.

In some cases, the local memory controller 260 may be configured to perform a read operation (e.g., a sense operation) on one or more memory cells 205 of the memory die 200. During a read operation, the logic state stored on a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205.

In some cases, sense component 245 may further determine a logic state of an indicator associated with the logic state that may be stored on the memory cell 205, where the indicator indicates whether the stored logic state may be a transformed version of a different logic state. If the stored logic state may be a transformed version of a different logic state, the local memory controller 260 may communicate the stored logic state to the controller 105 using the input/output 255 as part of the read operation. In this example, the local memory controller 260 may communicate that the logic state stored on the memory cell 205 may be a transformed version of a different logic state. Alternatively, the local memory controller 260 may transform the stored logic state into the different logic state and communicate the different logic state to the controller 105 using the input/output 255 as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
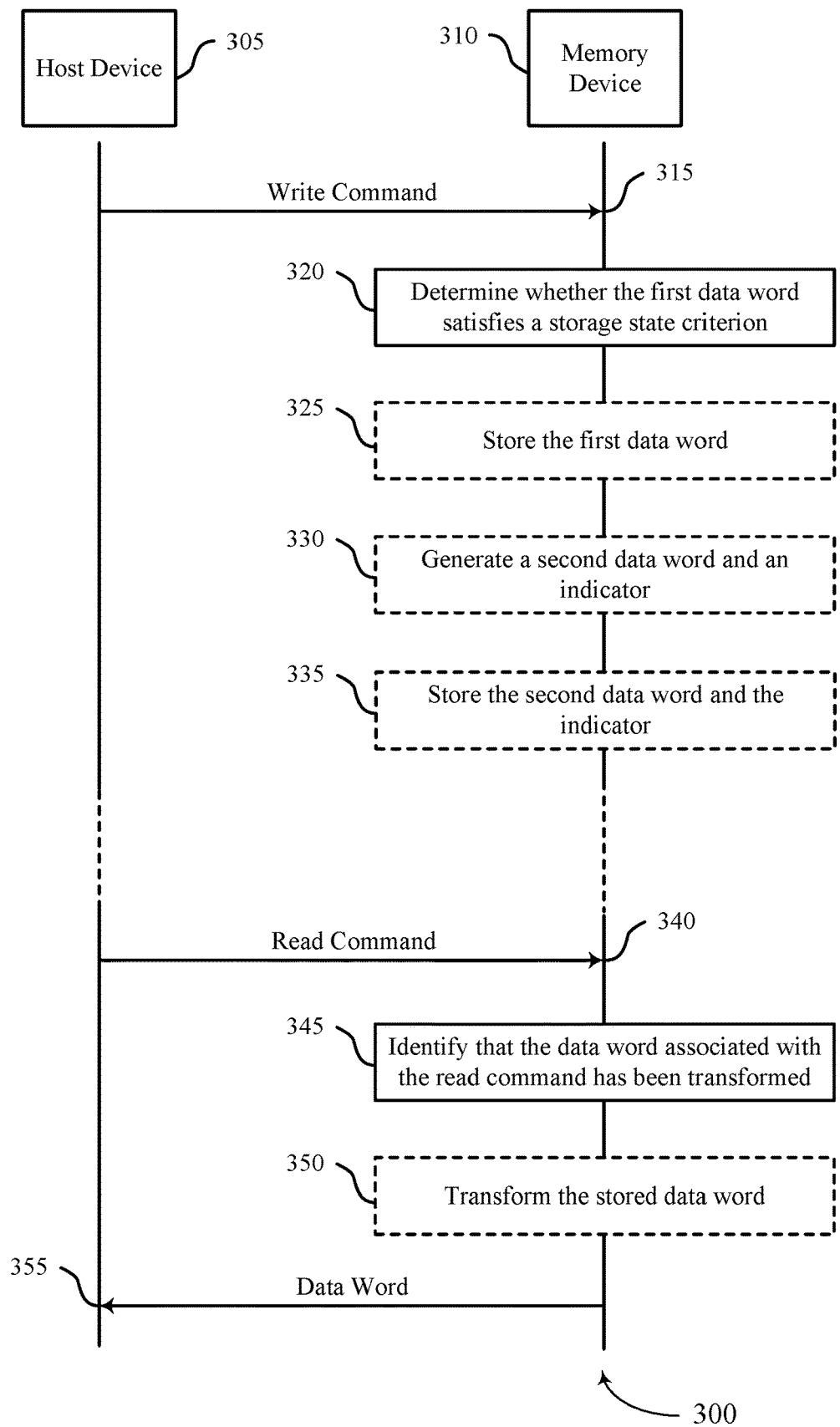
FIG. 3 illustrates an example of a process flow that supports data storage based on data polarity in accordance with the present disclosure.

FIG. 3 illustrates an example of a process flow 300 that supports data storage based on data polarity in accordance with disclosed herein. In some examples, process flow 300 may implement aspects of the system 100 and the memory die 200. For example, the host device 305 may be an example of the host device described with reference to FIG. 1 and the memory device 310 may be an example of memory device 110. The process flow 300 illustrates a write operation and a read operation, where the write and read operations may include transforming data based on data polarity at the memory device 310.

The host device 305 may initiate a write operation at the memory device 310. The write operation may include the host device 305 transmitting write command 315 to the memory device 310. Write command 315 may comprise a first data word that is to be stored in the memory device 310. The host device 305 may identify information to be stored in the memory device 310 and may generate the first data word based on that identified information.

At 320, the memory device 310 may determine whether the first data word satisfies a storage state criterion. In some instances, the storage state criterion may indicate a characteristic of the memory cells associated with the memory device 310. In turn, the characteristic may indicate a symbol type that is associated with poorer performance such as higher data leakage or increase power consumption compared to one or more other symbol types. That is, the storage state criterion may be associated with the memory device 310 and may be a criterion related to a symbol type that is associated with poorer performance.

The storage state criterion determined at 320 may indicate a first data retention characteristic indicating a symbol type the memory device 310 that exhibits more leakage when stored in the memory device 310 compared to one or more other symbol types. In another example, the storage state criterion may indicate a first power consumption characteristic indicating a symbol type that is configured to be stored in the memory device 310 that exhibits more power consumption compared to one or more symbol types configured to be stored in the memory device that are not indicated by the first power consumption characteristic.

Additionally or alternatively, the memory device 310 may also determine a second storage state criterion at 320. The second storage state criterion may indicate a symbol type or types that are associated with increased overall performance compared to the symbol type corresponding to the first storage state criterion. In some cases, the memory device 310 may determine a quantity of symbols of the first data word that are a symbol type associated with the second data retention characteristic of the one or more memory cells of the memory device. If the memory device 310 may determine that the quantity of symbols of the first data word that are the symbol type associated with the second data retention characteristic satisfies the second data retention characteristic threshold, the memory device 310 may store the first data word at 325. For example, the memory device 310 may determine that the quantity of symbols of the first data word that are associated with the second data retention characteristic may exceed a threshold number and/or satisfy a storage state threshold for the memory device 310. Therefore, if the memory device 310 determines that the first data word satisfies the second storage state criterion, the memory device 310 may store the data word included in write command 315 without performing a transformation.

The memory device 310, however, may determine that the quantity of symbols of the first data word that are the symbol type associated with the second data retention characteristic fails to satisfy the second data retention characteristic threshold of the memory device. For example, the quantity of symbols of the first data word that are associated with the second data retention characteristic may be under a threshold number. That is, the first data word may fail to satisfy a storage state threshold of the memory device. In such instances, the memory device 310 may determine that the first data word satisfies the first storage state criterion as it relates to the symbol types that exhibit detrimental behavior. In this example, the memory device 310 may generate a second data word and a corresponding indicator at 330. The second data word may satisfy the second storage state criterion, where the second data word may be generated by applying a transformation to the first data word based on determining that the first data word satisfies a first storage state criterion. In some cases, the memory device 310 may determine that the quantity of symbols of the second data word that are the symbol type associated with the second data retention characteristic satisfies the storage state threshold of the memory device 310. The memory device 310 may then determine that the second data word satisfies the second storage state criterion based on determining that the quantity of symbols of the second data word that are the symbol type associated with the second data retention characteristic satisfies the storage state threshold of the memory device 310.

At 330, the memory device 310 may optionally modify one or more symbols of the first data word to generate the second data word (in some cases each symbol of the first data word may be modified). The memory device 310 may determine a quantity of symbols of the second data word that are a symbol type associated with the second data retention characteristic and determine that the second data word satisfies the second storage state criterion based no determining the quantity of symbols of the second data word that are a symbol type associated with the second data retention characteristic. In some cases, the first data word may include two symbol types and the transformation may be an example of a data bit inversion. That is, each '0' or low value of the first data word may be transformed into a '1' or high value in the second data word. Similarly, each '1' or high value of the first data word may be transformed into a '0' or low' value in the second data word. In other examples, the first data word and the second data word may include three or more symbol types. In these examples, each symbol type of the first data word may be mapped to a different symbol type for the second data word.

In some examples, the memory device 310 also generates an indicator at 330. The indicator may indicate that the second data word stored in the memory device 310 is a transformed version of the first data word. The indicator may be generated based on generating the second data word. In some cases, the indicator may indicate how each symbol type of the first data word is modified as part of the transformation used to generate the second data word stored in the memory device. For example, in the case of the first and second data word each including three or more symbol types, the indicator may indicate a mapping of symbol types used to generate the second data word. In some instances, the indicator may allow the memory device to properly read the data stored within the second data word (e.g., reverse the transformation as part of a read operation). In the case that the memory device 310 generates a second data word, at 335, the memory device 310 may store the second data word and the corresponding indicator based on determining that the second data word satisfies the second storage state criterion. In some cases, the indicator may be stored in a first portion of the memory device that is different than a second portion of the memory device 310 that stores the second data word.

The host device 305 may initiate a read operation at the memory device 310. The read operation may occur independently of the write operation occurring at 315, 320, 325, 330, 335, and 340. The read operation may begin with the host device 305 transmitting a read command 340 to the memory device 310. In some cases, read command 340 may be associated with a location of the memory device 310. The memory device 310 may determine a data word associated with the location indicated by read command 340.

At 345, the memory device 310 may identify that the data word stored at the location is associated with a second data word. That is, the memory device 310 may identify that the stored data word is a first data word that is a transformed version of a second data word. In some cases, the memory device 310 identifies that the first data word is associated with the second data word by identifying an indicator stored in the memory device 310, which indicates that the first data word may be a transformed version of the second data word.

At 350, the memory device 310 may optionally transform the stored data word. In some cases, the memory device 310 may transform the symbols of the first data word to generate the second data word based on identifying that first data word is associated with the second data word. That is, the memory device 310 may modify each symbol of the first data word to generate the second data word. In some cases, the first and second data words may each include three or more symbol types. In these cases, each of the three or more symbol types of the first data word may be mapped to a different symbol type of the second data word. In some cases, the memory device 310 may apply the transformation based on the indicator. That is, the memory device 310 may apply the transformation according to a transformation indicated by the indicator. In this example, the indicator may inform the memory device 310 how each symbol of the second data word was modified as part of a transformation used to generate the first data word (and consequently an inverse transformation to generate the second data word from the first data word). However, in other cases, the memory device 310 may optionally not transform the stored data word. In these cases, the memory device 310 may identify that the first data word may not be a transformed version of a second data word. For example, the memory device 310 may identify that the indicator stored in the memory device 310 indicates that the first data word is not a transformed version of a second data word. Alternatively, the memory device 310 may identify whether or not the first data word may be a transformed version of the second data word.

At 355, the memory device 310 may transmit a data word to the host device 305. In some cases, if the memory device 310 transformed the stored data word, the memory device 310 may transmit the second data word to the host device 305. In some other cases, the memory device 310 may not have identified that the first data word may be a transformed version of a second data word. In this case, the memory device 310 may transmit the stored first data word. In this case, the host device 305 may determine that the first data word may be a transformed version of the second data word and transform the first data word to generate the second data word. In other cases, the memory device 310 may transmit the stored data word based on determining that the first data word may not be a transformed version of a second data word.

Figure 4:
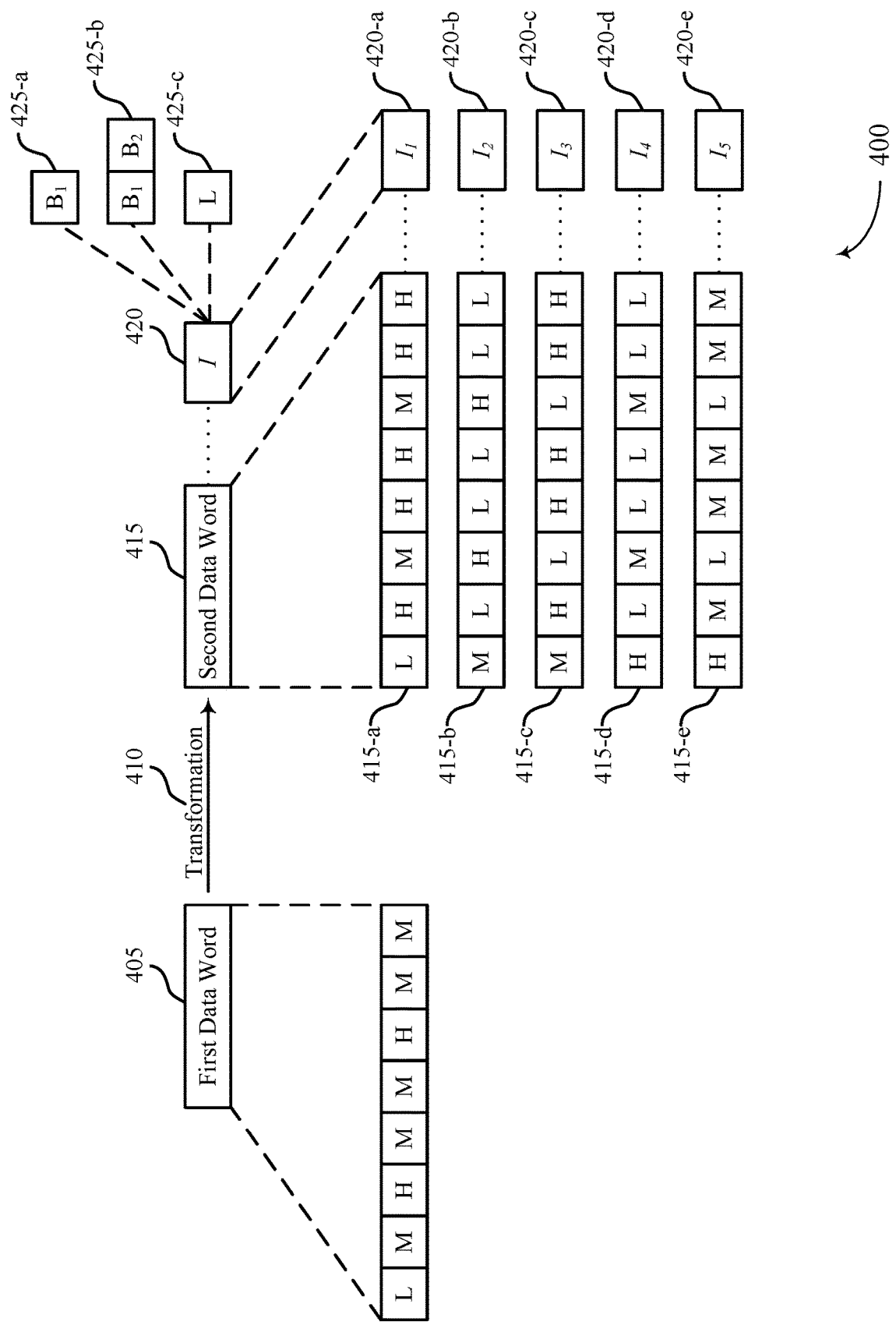
FIG. 4 illustrates examples of data transformations that support data storage based on data polarity in accordance with the present disclosure.

FIG. 4 illustrates examples of data transformations 400 that support data storage based on data polarity in accordance with disclosed herein. In some examples, the data transformations 400 may implement aspects of the system 100, the memory die 200, as well as process flow 300. Data transformations 400 may depict a transformation 410 of first data word 405 into second data word 415. Data transformations 400 may further depict a corresponding indicator 420, which may be an example of an indicator as described with reference to FIG. 3. FIG. 4 also illustrates the five possible second data words 415 that may result from transformation 410 of first data word 405. Additionally, data transformations 400 may include several possible configurations 425 of indicator 420.

In the examples illustrated by FIG. 4, the first data word 405 may include eight bits, where each discrete unit of the first data word 405 may be represented by more than two unique symbol types. For example, a discrete unit of the first data word 405 may be a low (L) value, a medium (M) value, or a high (H) value. In other cases, however, the first data word 405 may include any number of bits (e.g., one, two, three, four, five, six, seven, eight, or more). In some cases, each discrete unit may be represented any number of unique symbol types (e.g., four symbol types, five symbol types, or more). As such, the present disclosure is not limited to data words that store a particular value set.

A memory device may be instructed to store the information contained in first data word 405. However, the memory device may have specific storage state criterion indicating a characteristic of the memory cells within the memory device. For example, a first storage state criterion may correspond to a first characteristic indicating a type of symbol(s) (e.g., the information stored within each bit) that exhibits poorer performance when stored and/or read by the memory device compared to other types of symbol(s). The performance of a symbol type may be related to data retention (i.e., certain symbol types may exhibit worse data retention characteristics than others due to, for example, leakage), power consumption (i.e., the memory device may consume more power storing and/or reading one or more types of symbol versus another type of symbol), etc. Additionally or alternatively, a second storage state criterion may correspond to a second characteristic of the memory device that indicates a type of symbol(s) that exhibits increased overall performance when stored and/or read by the memory device. For example, the second characteristic may indicate a symbol type that is associated with better data retention or less power consumption.

The memory device may use the storage state criterion to determine whether the data word should be transformed before it is stored in the memory cells of the memory device. Such a determination may be based on the data word satisfying a storage state threshold that is associated with the first and/or second characteristic of the memory device. For example, a first storage state criterion may indicate a storage state threshold that if met, the memory device determines to transform first data word 405 prior to storing the information contained within first data word 405. Additionally or alternatively, there may be a second storage state criterion.

In some cases, the second storage state criterion may indicate a minimum number of symbols of a given symbol type within a data word to be stored that are indicated by the second characteristic as exhibiting increased overall performance compared to other symbol types. For example, a memory device may have a first characteristic indicating that '0' bits exhibit poorer overall performance and a second characteristic indicating that '1' bits exhibit increased overall performance. In this example, the first storage state criterion may indicate that a data word to be stored (e.g., first data word 405) may be transformed if it contains five or more '0' bits while the second storage state criterion may indicate that the data word to be stored must contain three or more '1' bits. In other cases, the second storage state criterion may be the opposite of the first storage state criterion. In this case, the memory device may use a single storage state threshold. That is, if a data word to be stored satisfies the threshold, the data word may be transformed. Alternatively, if the data word to be stored does not satisfy the threshold, the data word may be stored by the memory device. For example, in a memory device where the first storage state criterion indicates that a data word to be stored may be transformed if it contains five or more 'M' bits, the second storage state criterion may indicate that a data word may be stored if it contains less than five 'M' bits.

If first data word 405 satisfies the first storage state criterion of the memory device, the memory device may determine a transformation 410 to generate a second data word 415 that satisfies the second storage state criterion. Five possible transformations of first data word 405 may be illustrated by the second data words 415-a, 415-b, 415-c, 415-d, and 415-e. Each of the second data words 415 may be generated by mapping each symbol type of first data word 405 to a different symbol type to generate second data word 415. In the example above where the first and second storage state criterions indicate independent storage state thresholds, the memory device may determine that first data word 405 satisfies the first storage state criterion as first data word 405 contains 5 'M' bits, which aligns with the storage state threshold of containing five or more 'M' bits. Therefore, the memory device may determine a transformation 410 which generates second data word 415, where second data word 415 satisfies the second storage state criterion of containing three or more 'L' bits. In this example, memory device may utilize a transformation 410 that generates second data word 415-b. Therefore, second data word 415-b may then have one 'M' bit and have five 'L' bits. The second data word 415-b may be generated by mapping each 'L' bit of first data word 405 to an 'M' bit for second data word 415-b, each 'M' bit of first data word 405 to an 'L' bit for second data word 415-b, and each 'H' bit of first data word 405 to an 'H' bit for second data word 415-b.

However, in the example above where the first and second storage state criterions each indicate the same storage state threshold, the memory device may determine that first data word 405 satisfies the first storage state criterion as first data word 405 contains 5 'M' bits, which aligns with the storage state threshold of containing five or more 'M' bits. Therefore, the memory device may determine a transformation 410 which generates second data word 415, where the second data word 415 satisfies the second storage state criterion of containing less than five 'M' bits. In this example, memory device may utilize a transformation 410 that generates second data words 415-a, 415-b, 415-c, or 415-d. In each of second data words 415-a, 415-b, 415-c, and 415-d, there are one or two 'M' bits, which satisfies the second storage state criterion of less than five 'M' bits.

During the transformation 410, the memory device may generate an indicator 420 corresponding to the transformation 410 of first data word 405. Indicator 420 may indicate which transformation or mapping scheme used to generate second data word 415. For example, the memory device may generate indicator $I_2$ 420-b in the case that the memory device used the transformation 410 the generate second data word 415-b. The memory device may utilize one of configurations 425 for indicator 420. In some examples, indicator 420 may be configured according to configuration 425-a in which indicator 420 may be a single bit. In this example, indicator 420 may act to signal to the memory device that the second data word 415 may be a transformed version of the first data word 405. In such cases, the memory device may apply a preconfigured transformation 410 to the first data word 405. In some cases, the memory device may determine, based on knowing that the second data word 415 may be a transformed version of a first data word 405, the transformation 410 that was used to generate the second data word 415.

In another example, indicator 420 may be configured according to configuration 425-b in which indicator 420 may be two or more bits. In this example, the additional bits may allow the indicator 420 to indicate the transformation 410 utilized to generate second data word 415. For example, when a discrete unit of a data word may be represented by three or more symbol types, bits B1 and B2 of the configuration 425-b of the indicator 420 may indicate the mapping scheme of the transformation 410 used to generate second data word 415-b from first data word 405. For example, in a three symbol type data word, when the configuration 425-b is '00' that may indicate no transformation, a '01' may indicate a first type of transformation, and a '10' or '11' may indicate a second type of transformation.

In another example, indicator 420 may be configured according to configuration 425-c in which indicator 420 may be a single symbol that may be one of three or more possible symbol types. The indicator 420 configured according to the configuration 425-c may be a multi-level data unit (e.g., a discrete unit that may be include three or more different symbol types. In this example, the indicator 420 may indicate that second data word 415 may be a transformed version of first data word 405 and may indicate additional information relating to how each symbol of first data word 405 was modified to generate second data word 415. For example, in a three symbol type data word, when the configuration 425-c is an 'L' level that may indicate no transformation, a 'M' level may indicate a first type of transformation, and a 'H' level may indicate a second type of transformation.

Figure 5:
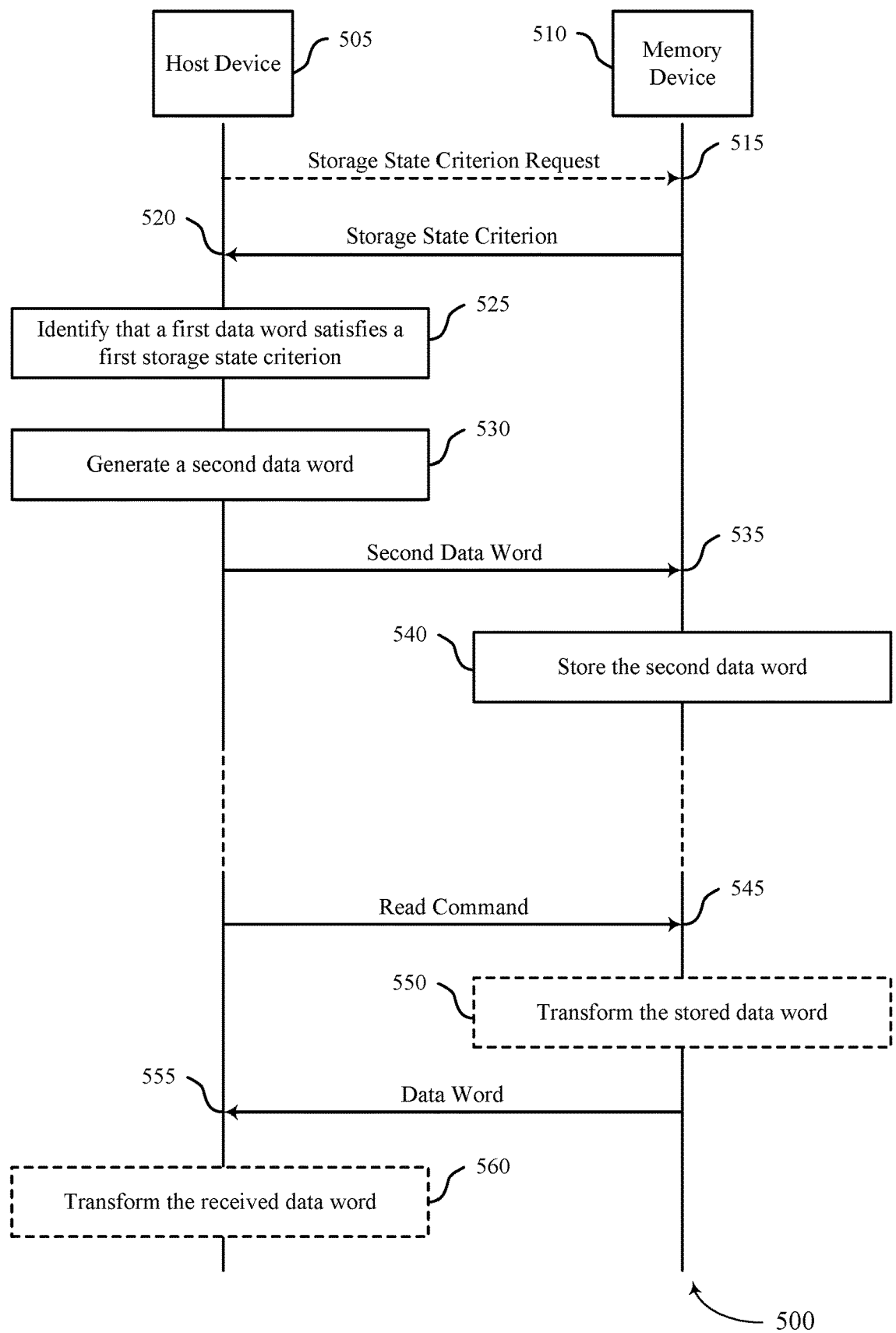
FIG. 5 illustrates an example of a process flow that supports data storage based on data polarity in accordance with the present disclosure.

FIG. 5 illustrates an example of a process flow 500 that supports data storage based on data polarity in accordance with disclosed herein. In some examples, process flow 500 may implement aspects of the system 100 and the memory die 200. The process flow 500 may include operations performed by a host device 505 and a memory device 510. The host device 505 may be an example of host device described with reference to FIG. 1 and the memory device 510 may be an example of memory device 110 described with reference to FIG. 1. The process flow 500 illustrates write and read operations which may include transforming data based on data polarity as implemented by the host device 505. The process flow 500 may incorporate portions of the functions of the process flow 300 described with reference to FIG. 3.

The host device 505 may initiate a write operation at the memory device 510. The write operation may optionally include the host device 505 transmitting a storage state criterion request to the memory device 510 at 515. The storage state criterion may indicate a characteristic of the memory cells of the memory device 510 pertaining to the performance of the memory device 510 when storing different symbol types (e.g., leakage rates associated with the storage states corresponding to different symbol types). In some cases, the memory device 510 may have a first storage state criterion indicating a symbol type that may be associated with poorer overall performance. In some examples, the symbol type indicated by the first storage state criterion may be associated with more leakage when stored in the memory device 510 compared to one or more other symbol types. In other examples, the symbol type indicated by the first storage state criterion may be associated with more power consumption when stored in the memory device 510 compared to one or more other symbol types. Additionally or alternatively, the memory device 510 may also have a second storage state criterion. The second storage state criterion may indicate a symbol type or types that are associated with increased overall performance when compared to the symbol type corresponding to the first storage state criterion.

Each storage state criterion may indicate a storage state threshold relating to a quantity of the symbol type that may be indicated by the storage state criterion. For example, the first storage state criterion may indicate a first storage state threshold indicating a maximum number of symbols of the symbol type associated with the first storage state criterion. In some cases, the second storage state criterion may indicate a second storage state threshold indicating a minimum number of symbols of the symbol type associated with the second storage state criterion. In other cases, the second storage state criterion may depend on the first storage state threshold. For example, while the first storage state criterion may relate to a data word that exceeds the first storage state threshold, the second storage state criterion may relate to a data word that does not meet the first storage state threshold.

At 520, the memory device 510 may transmit the first storage state criterion and/or the second storage state criterion to the host device 505. In some cases, the host device 505 may transmit the storage state criterion request based on receiving the storage state criterion request from the host device 505. In other cases, the memory device 510 may transmit the storage state criterion to the host device 505 without receiving the storage state criterion request, such as during an initialization phase of the memory device 510. The storage state criterion may indicate the storage state criterion associated with the memory cells of the memory device 510. In some cases, the host device 505 may transmit a storage state criterion request and receive the criterion from the memory device 510 prior to every write operation. In other cases, the host device 505 may store information associated with the storage state criterion of the memory device 510.

The host device 505 may determine the first storage state criterion and/or the second storage state criterion of the memory device 510 without the handshake procedure at 515 and 520. For example, the storage state criterion (and the corresponding characteristic) may be an intrinsic property of the memory device 510. In this example, the host device 505 may determine the storage state criterion based on a model number, manufacturer, etc. In such examples, the host device 505 may use the identifying information of the memory device 510 to look-up the storage state criterion using information stored in other memory or cache associated with the host device 505. In other examples, the storage state criteria may vary according to situation. For example, the performance of the memory device 510 when storing and/or reading a symbol type may differ according to process, previous data stored by the memory device 510, temperature, etc. In this example, the host device 505 may adjust the storage state criterion according to some predicted performance of the memory device 510.

In some cases, the host device 505 may determine the first storage state criterion and/or the second storage state criterion of the memory device 510 through a training procedure. The training procedure may include the host device 505 sending known data words to the memory device 510 as part of a write operation. The memory device 510 may transmit error detection signals to the host device 505. The host device 505 may analyze the power consumption associated with each of the write operations and/or error detection signals received from the memory device 510. The host device 505 may then determine characteristics of the memory device 510 when storing different symbol types. For example, the host device may identify a symbol type that may be associated with higher data leakage when compared to one or more other symbol types. In another example, the host device 505 may identify a symbol type that may be associated with higher power consumption during a write operation when compared to one or more other symbol types. The host device 505 may determine the first storage state criterion based on determining a symbol type associated with characteristics such as higher data leakage and/or power consumption. For example, the host device 505 may transmit a first set of data words including 'H' symbol types, a second set of data words including 'M' symbol types, and a third set of data words including 'L' symbol types. The host device 505 may determine which set of data words (and corresponding symbol type) may be associated with a higher error rate (i.e., based on receiving error detection signals from the memory device 510) when compared to the other sets of data words. The host device 505 may determine a first and/or second storage state criterion based on the characteristics of the memory device 510 when storing each of the symbol types.

At 525, the host device 505 may identify information to be stored in the memory device 510 and may generate the first data word based on that identified information. The host device 505 may identify that the first data word satisfies the first storage state criterion. That is, the host device 505 may determine that the first data word satisfies the storage state threshold indicated by the first storage state criterion.

At 530, the host device 505 may generate a second data word that satisfies a second storage state criterion. The host device 505 may generate the second data word by applying a transformation to the first data word based on determining that the first data word satisfies the first storage state criterion. In some cases, the host device 505 may modify each symbol of the first data word to generate the second data word. In some cases, each data word may include two symbol types and the transformation may be an example of a data bit inversion (i.e., each '0' value becomes a '1' and vice versa). In other cases, the first data word may include three or more symbol types. In these examples, each symbol type of the first data word may be mapped to a different symbol type for the second data word.

At 535, the host device 505 may send the second data word to the memory device 510. At 540, the memory device 510 may store the second data word received at 535 from the host device 505.

In some cases, the host device 505 may initiate a read operation at the memory device 510. The read operation may occur independently of the write operation occurring at 515, 520, 525, 530, 535, and 540. The read operation may begin with the host device 505 transmitting a read command 545 to the memory device 510. In some cases, the read command 545 may be associated with a location of the memory device 510. The memory device 510 may determine a stored data word associated with the location indicated by the read command 545. In some cases, the stored data word may be a first data word that may be a transformed version of a second data word. In this example, the read command may optionally include a transformation indicator commanding the memory device 510 to transform the first data word into the second data word.

At 550, the memory device 510 may optionally transform the stored data word to generate the second data word. In some cases, the memory device 510 may transform the stored data word if the memory device 510 receives a transformation indicator from the host device 505 at 545 within the read command.

At 555, the memory device 510 may transmit a data word to the host device 505. In the case that the read command 545 included a transformation indicator, the data word transmitted at 555 may be the second data word. In the case that the read command 545 did not include a transformation indicator, the data word transmitted at 555 may be the stored data word. In this case, at 560, the host device 505 may transform the stored data word received at 555 to generate the second data word.

Figure 6:
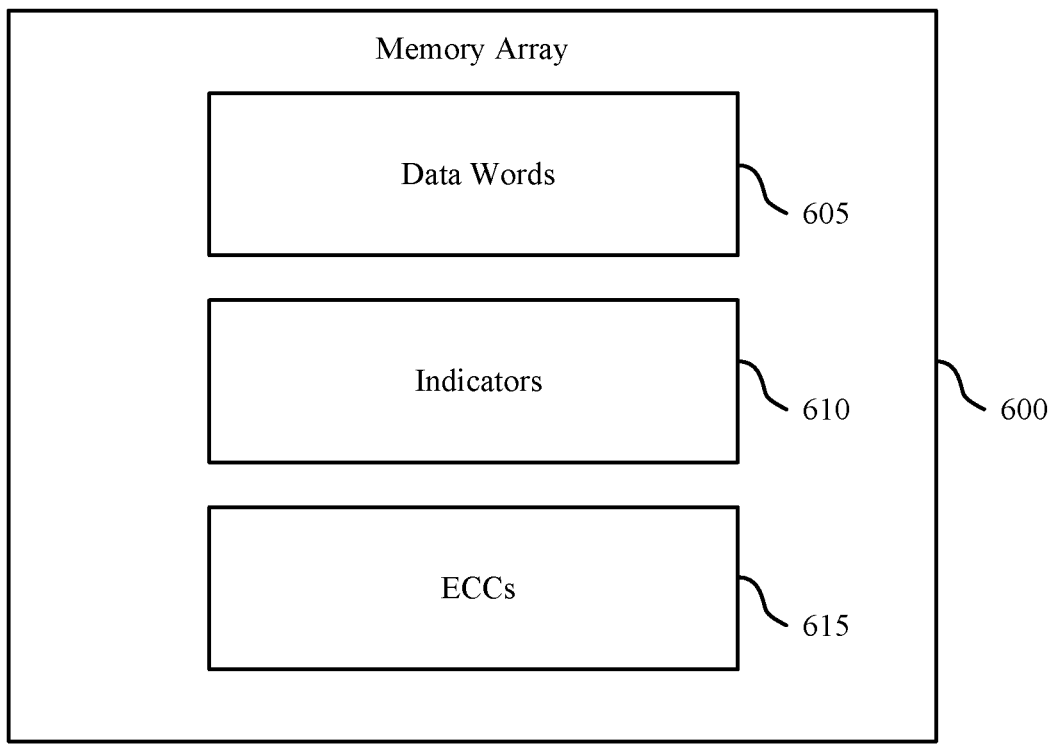
FIG. 6 a block diagram of a device that supports data storage based on data polarity in accordance with the present disclosure.

FIG. 6 illustrates an example of a block diagram of memory array 600 that supports data storage based on data polarity in accordance with disclosed herein. In some examples, block diagram of memory array 600 may implement aspects of the system 100 and the memory die 200. For example, memory array 600 may be an example of aspects of memory arrays 170. Further, memory array 600 may be configured to perform the processes described with reference to FIGS. 3 and 5 as well as the example data transformations described with reference to FIG. 4.

Memory array 600 may include partitions 605, 610, and 615 which may store data words, indicators, and error correction codes (ECCs) respectively. Each partition may include one or more memory cells of memory array 600.

Partition 605 may store one or more data words, which may be examples of the first and second data words as described with reference to FIGS. 3, 4, and 5. In some cases, partition 605 may store data words that are not transformed versions of a different data word. However, in other cases, partition 605 may store data words that are transformed versions of different data words. In some instances, each data word stored in partition 605 may satisfy a second storage state criterion indicating a characteristic of memory array 600 which causes a certain symbol type or types to exhibit less detrimental behavior when read or stored than a different symbol type. That is, each data word stored within partition 605 may comprise at least a certain number of symbols (i.e., a quantity of symbols that is indicated by a storage state threshold) that are a symbol type that may exhibit less detrimental behavior than other symbols. Thus, partition 605 may store data words to reduce the occurrence of certain symbols associated with more detrimental behavior (e.g., poor data retention or higher power consumption).

Partition 610 may store indicators as described with reference to FIGS. 3 and 4. Each stored indicator may correspond to a stored data word. The indicators may indicate that a data word associated with the indicator may be a transformed version of a different data word. The stored data word may have been transformed prior to being stored based on the storage state criterion indicating a data retention characteristic or power consumption characteristic of the memory cells of memory array 600. The indicators may further indicate how each symbol type of each stored data word may have been modified as part of the transformation used to generate the first data word stored in partition 605 of memory array 600. Memory array 600 may be configured to transform the stored data word into the different data word indicated by the indicators.

Memory array 600 may further comprise a third partition 615 for storing ECC information associated with each data word stored in partition 605. The ECC may allow memory array 600 to detect errors within a data word or words during a read operation. In this example, memory array 600 may store both an ECC and an indicator for each data word stored by memory array 600. For example, a data word that is to be stored which does not contain any symbols of the type that are associated with more detrimental behavior may be stored without being transformed. In this example, memory array 600 may store the original data word in partition 605, an indicator indicating that the stored data word may not be a transformed version of another data word in partition 610, and an ECC relating to the data word in partition 615. In another example, the data word that is to be stored may contain a quantity of symbols of the type that are more detrimental than other symbol types. In this example, memory array 600 may transform the original data word to generate a second data word. In this example, memory array 600 may store the second data word in partition 605, an indicator indicating that the stored data word may be a transformed version of another data word in partition 610, and an ECC relating to the second data word in partition 615.

In some cases, each of partitions 605, 610, and 615 may be non-overlapping portions of memory within memory array 600. In other cases, partitions 605, 610, and 615 may overlap partially or completely. For example, partition 610 storing indicators may utilize overlapping memory cells of memory array 600 as partition 615 for storing ECCs.

Figure 7:
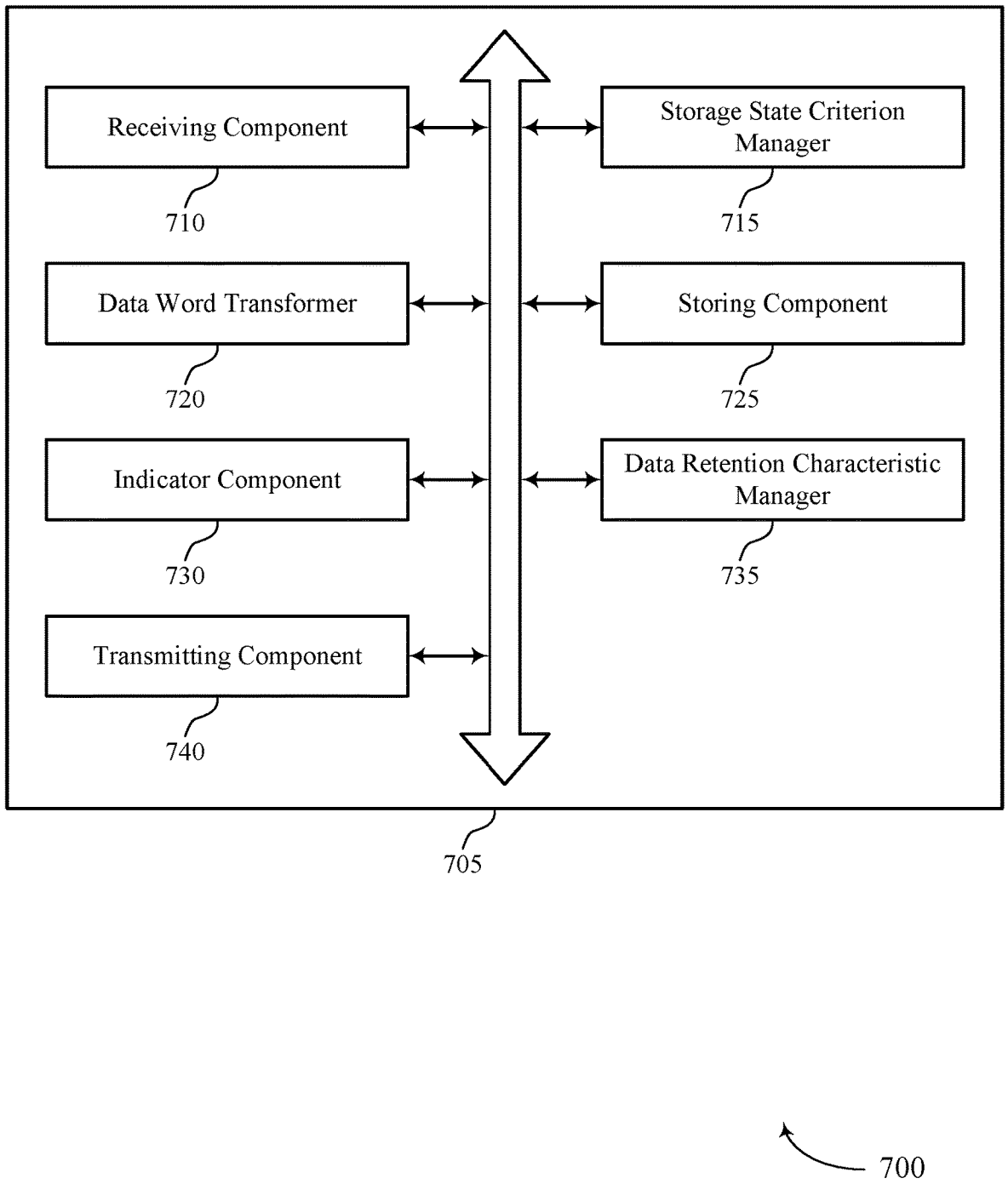
FIG. 7 shows a block diagram of a device that supports data storage based on data polarity in accordance with the present disclosure.

FIG. 7 illustrates an example of a block diagram 700 of a memory device 705 that supports data storage based on data polarity in accordance with disclosed herein. The memory device may be an example of aspects of the memory device 110, 310, 510, and memory die 200. The memory device 705 may include receiving component 710, storage state criterion manager 715, data word transformer 720, storing component 725, indicator component 730, data retention characteristic manager 735, and transmitting component 740. Each of these components may communicate, directly or indirectly, with one another (e.g., via one or more buses) and may be implemented by a device memory controller or a local memory controller.

In some cases, such as during a write or program operation, receiving component 710 may receive, from a host device, a first data word to be stored in memory device 705. In some cases, receiving component 710 may receive a third data word from the host device to be stored in memory device 705. In some instances, such as during a read operation, receiving component 710 may receive, from a host device, a read command associated with a location of memory device 705.

Storage state criterion manager 715 may determine that the first data word satisfies a first storage state criterion of the memory device, the first storage state criterion indicating a first data retention characteristic of one or more memory cells of memory device 705. In other cases, storage state criterion manager 715 may determine that a second data word satisfies a second storage state criterion based on determining that the quantity of symbols of the second data word that are the symbol type associated with the second data retention characteristic satisfies the storage state threshold of memory device 705, where storing the second data word in memory device 705 may be based on determining that the second data word satisfies the second storage state criterion. In some instances, storage state criterion manager 715 may determine that the third data word satisfies the second storage state criterion of memory device 705.

Data word transformer 720 may generate a second data word that satisfies a second storage state criterion by applying a transformation to the first data word based on determining that the first data word satisfies the first storage state criterion, the second storage state criterion indicating a second data retention characteristic of the one or more memory cells of memory device 705. In some cases, data word transformer 720 may generate the second data word by modifying each symbol of the first data word to generate the second data word, the first data word and the second data word each including three or more symbol types, where each symbol type of the first data word may be mapped to a different symbol type of the second data word.

Data word transformer 720 may apply a transformation to symbols of the first data word stored in memory device 705 to generate the second data word based on identifying that the first data word stored in memory device 705 may be associated with the second data word. In some cases, data word transformer 720 may modify each symbol of the first data word to generate the second data word, the first data word and the second data word each including three or more symbol types, where each symbol type of the first data word may be mapped to a different symbol type of the second data word.

Storing component 725 may store the second data word in memory device 705. In some cases, storing component 725 may store an indicator in memory device 705. In some examples, the indicator may be stored in a first portion of memory device 705 that may be different than a second portion of memory device 705 that stores the second data word. In some instances, storing component 725 may store the third data word in memory device 705. In some cases, such as during a read operation, storing component 725 may identify that a first data word stored at the location indicated by a read command may be associated with a second data word.

Indicator component 730 may generate an indicator that the second data word stored in memory device 705 may be a transformed version of the first data word based on generating the second data word. In some cases, the indicator may indicate how each symbol type of the first data word may be modified as part of the transformation used to generate the second data word stored in memory device 705. In some cases, such as during a read operation, indicator component 730 may identify an indicator stored in memory device 705 that indicates that the first data word may be a transformed version of the second data word, where applying the transformation may be based on the indicator. In some instances, the indicator may indicate how each symbol type of the first data word may be modified as part of the transformation used to generate the first data word, where applying the transformation may be based on the transformation indicated in the indicator.

Data retention characteristic manager 735 may determine a quantity of symbols of the first data word that are a symbol type associated with the second data retention characteristic of the one or more memory cells of memory device 705. In some cases, data retention characteristic manager 735 may determine that the quantity of symbols of the first data word that are the symbol type associated with the second data retention characteristic fails to satisfy a storage state threshold of memory device 705. In some examples, data retention characteristic manager 735 may determine a quantity of symbols of the second data word that are a symbol type associated with the second data retention characteristic of memory device 705 for storing in the one or more memory cells. In some instances, data retention characteristic manager 735 may determine that the quantity of symbols of the second data word that are the symbol type associated with the second data retention characteristic satisfies a storage state threshold of memory device 705. In some examples, the second data retention characteristic may indicate a symbol type that may be configured to be stored in memory device 705 that exhibits less leakage compared to one or more symbol types configured to be stored in memory device 705 that are indicated by the first data retention characteristic.

Transmitting component 740 may, during a read operation for example, transmit a second data word to the host device.

An apparatus for data storage based on data polarity is described. The apparatus may include means for receiving, from a host device, a first data word to be stored in a memory device, determining, by the memory device, that the first data word may satisfy a first storage state criterion of the memory device. In some cases, the first storage state criterion may indicate a first data retention characteristic of one or more memory cells of the memory device. The apparatus may include means for generating a second data word that satisfies a second storage state criterion by applying a transformation to the first data word based on determining that the first data word satisfies the first storage state criterion. In some examples, the second storage state criterion may indicate a second data retention characteristic of the one or more memory cells of the memory device. In some cases, the apparatus may include means for storing the second data word in the memory device.

Some examples of the method and apparatus described herein may further include operations or means for generating an indicator that the second data word stored in the memory device may be a transformed version of the first data word based on generating the second data word and storing the indicator in the memory device.

In some examples of the method and apparatus described herein, the indicator may indicate how each symbol type of the first data word may be modified as part of the transformation used to generate the second data word stored in the memory device.

In some examples of the method and apparatus described herein, the indicator may be stored in a first portion of the memory device that may be different than a second portion of the memory device that stores the second data word.

Some examples of the method and apparatus described herein may further include operations or means for modifying each symbol of the first data word to generate the second data word. In some cases, the first data word and the second data word may each include three or more symbol types, where each symbol type of the first data word may be mapped to a different symbol type of the second data word.

Some examples of the method and apparatus described herein may further include operations or means for determining a quantity of symbols of the first data word that may be a symbol type associated with the second data retention characteristic of the one or more memory cells of the memory device. Some examples of the method and apparatus described herein may further include operations or means for determining that the quantity of symbols of the first data word that may be the symbol type associated with the second data retention characteristic may fail to satisfy a storage state threshold of the memory device.

Some examples of the method and apparatus described herein may further include operations or means for determining a quantity of symbols of the second data word that may be a symbol type associated with the second data retention characteristic of the memory device for storing in the one or more memory cells and determining that the quantity of symbols of the second data word that may be the symbol type associated with the second data retention characteristic may satisfy a storage state threshold of the memory device. In some cases, the method and apparatus described herein may further include operations or means for determining that the second data word may satisfy the second storage state criterion based on determining that the quantity of symbols of the second data word that may be the symbol type associated with the second data retention characteristic may satisfy the storage state threshold of the memory device. In some examples, storing the second data word in the memory device may be based on determining that the second data word satisfies the second storage state criterion.

In some examples of the method and apparatus described herein, the second data retention characteristic indicates a symbol type that may be configured to be stored in the memory device that exhibits less leakage compared to one or more symbol types configured to be stored in the memory device that may be indicated by the first data retention characteristic.

Some examples of the method and apparatus described herein may further include operations or means for receiving a third data word from the host device to be stored in the memory device, determining, by the memory device, that the third data word satisfies the second storage state criterion of the memory device, and storing the third data word in the memory device.

An apparatus for data storage based on data polarity is described. The apparatus may include means for receiving, from a host device, a read command associated with a location of a memory device, and identifying, by the memory device, that a first data word stored at the location may be associated with a second data word. The apparatus may further include means for applying a transformation to symbols of the first data word stored in the memory device to generate the second data word based on identifying that the first data word stored in the memory device may be associated with the second data word and sending the second data word to the host device.

Some examples of the method and apparatus described herein may further include operations or means for identifying an indicator stored in the memory device that indicates that the first data word may be a transformed version of the second data word, where applying the transformation may be based on the indicator.

In some examples of the method and apparatus described herein, identifying that the first data word stored in the memory device may be associated with the second data word further may include operations, features, means, or instructions for identifying an indicator stored in the memory device that indicates how each symbol type of the first data word may be modified as part of the transformation used to generate the first data word, where applying the transformation may be based on the transformation indicated in the indicator.

In some examples of the method and apparatus described herein, applying the transformation to the first data word stored in the memory device to generate the second data word further may include operations, features, means, or instructions for modifying each symbol of the first data word to generate the second data word, the first data word and the second data word each including three or more symbol types. In some cases, each symbol type of the first data word may be mapped to a different symbol type of the second data word.

An apparatus for data storage based on data polarity is described. The apparatus may include means for identifying, by a host device, that a first data word to be stored in a memory device may satisfy a first storage state criterion of the memory device. In some examples, the first storage state criterion may indicate a first data retention characteristic of one or more memory cells of the memory device. The apparatus may include means for generating a second data word that may satisfy a second storage state criterion by applying a transformation to the first data word based on determining that the first data word may satisfy the first storage state criterion. In some cases, a second data retention characteristic may indicate a symbol type that may be configured to be stored in the one or more memory cells that exhibits less leakage compared to one or more symbol types configured to be stored in the one or more memory cells that are indicated by the first data retention characteristic. The apparatus may further include means for sending the second data word to the memory device.

Some examples of the method and apparatus described herein may further include operations or means for receiving, from the memory device, a message indicating the first storage state criterion associated with the one or more memory cells.

Some examples of the method and apparatus described herein may further include operations or means for sending, to the memory device, a request for the first storage state criterion of the one or more memory cells, where receiving the message may be based on sending the request.

In some examples of the method and apparatus described herein, generating the second data word by applying the transformation to the first data word further may include operations, features, means, or instructions for modifying each symbol of the first data word to generate the second data word, the first data word and the second data word each including three or more symbol types, where each symbol type of the first data word may be mapped to a different symbol type of the second data word.

Some examples of the method and apparatus described herein may further include operations or means for sending, to the memory device, a read command for a stored data word, the read command including a transformation indicator commanding the memory device to transform the stored data word and receiving, from the memory device, a transformed data word.

Some examples of the method and apparatus described herein may further include operations or means for sending, to the memory device, a read command for the second data word, receiving, from the memory device, the second data word, and transforming the second data word to generate the first data word.

Figure 8:
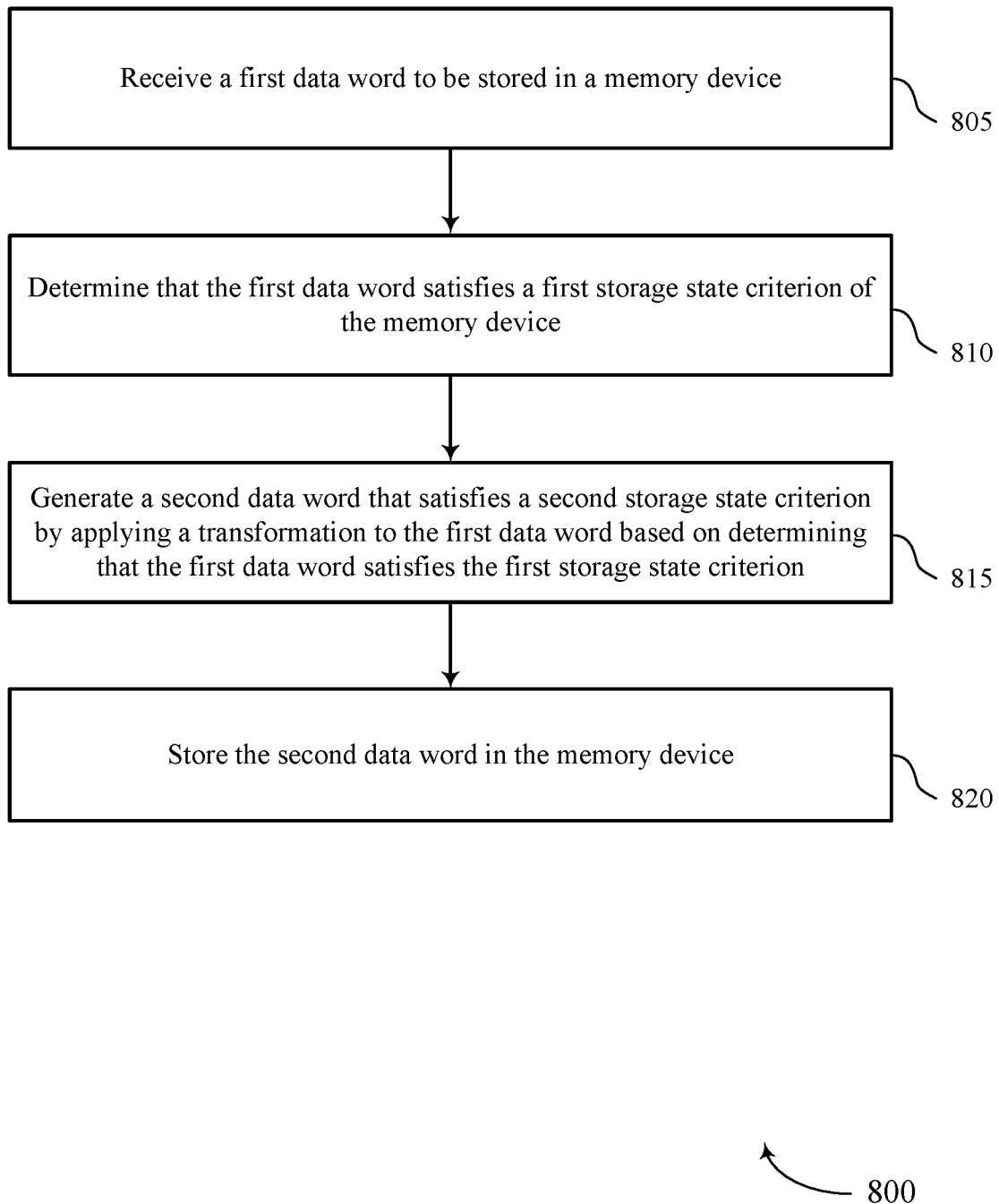
FIGS. 8 through 11 show flowcharts illustrating a method or methods that support data storage based on data polarity in accordance with the present disclosure.

FIG. 8 shows a flowchart illustrating a method 800 that supports data storage based on data polarity in accordance with disclosed herein. The operations of method 800 may be implemented by a memory device or its components as described herein. For example, the operations of method 800 may be performed by a memory device as described with reference to FIGS. 1 through 4, 6, and 7. In some examples, a memory device may execute a set of instructions to control the functional elements of the memory device to perform the functions described below. Additionally or alternatively, a memory device may perform aspects of the functions described below using special-purpose hardware.

At 805, the memory device may receive, from a host device, a first data word to be stored in a memory device. The operations of 805 may be performed according to the methods described herein. In some examples, aspects of the operations of 805 may be performed by a memory device as described with reference to FIGS. 1 through 4, 6, and 7.

At 810, the memory device may determine that the first data word satisfies a first storage state criterion of the memory device, the first storage state criterion indicating a first data retention characteristic of one or more memory cells of the memory device. The operations of 810 may be performed according to the methods described herein. In some examples, aspects of the operations of 810 may be performed by a memory device as described with reference to FIGS. 1 through 4, 6, and 7.

At 815, the memory device may generate a second data word that satisfies a second storage state criterion by applying a transformation to the first data word based on determining that the first data word satisfies the first storage state criterion, the second storage state criterion indicating a second data retention characteristic of the one or more memory cells of the memory device. The operations of 815 may be performed according to the methods described herein. In some examples, aspects of the operations of 815 may be performed by a memory device as described with reference to FIGS. 1 through 4, 6, and 7.

At 820, the memory device may store the second data word in the memory device. The operations of 820 may be performed according to the methods described herein. In some examples, aspects of the operations of 820 may be performed by a memory device as described with reference to FIGS. 1 through 4, 6, and 7.

Figure 9:
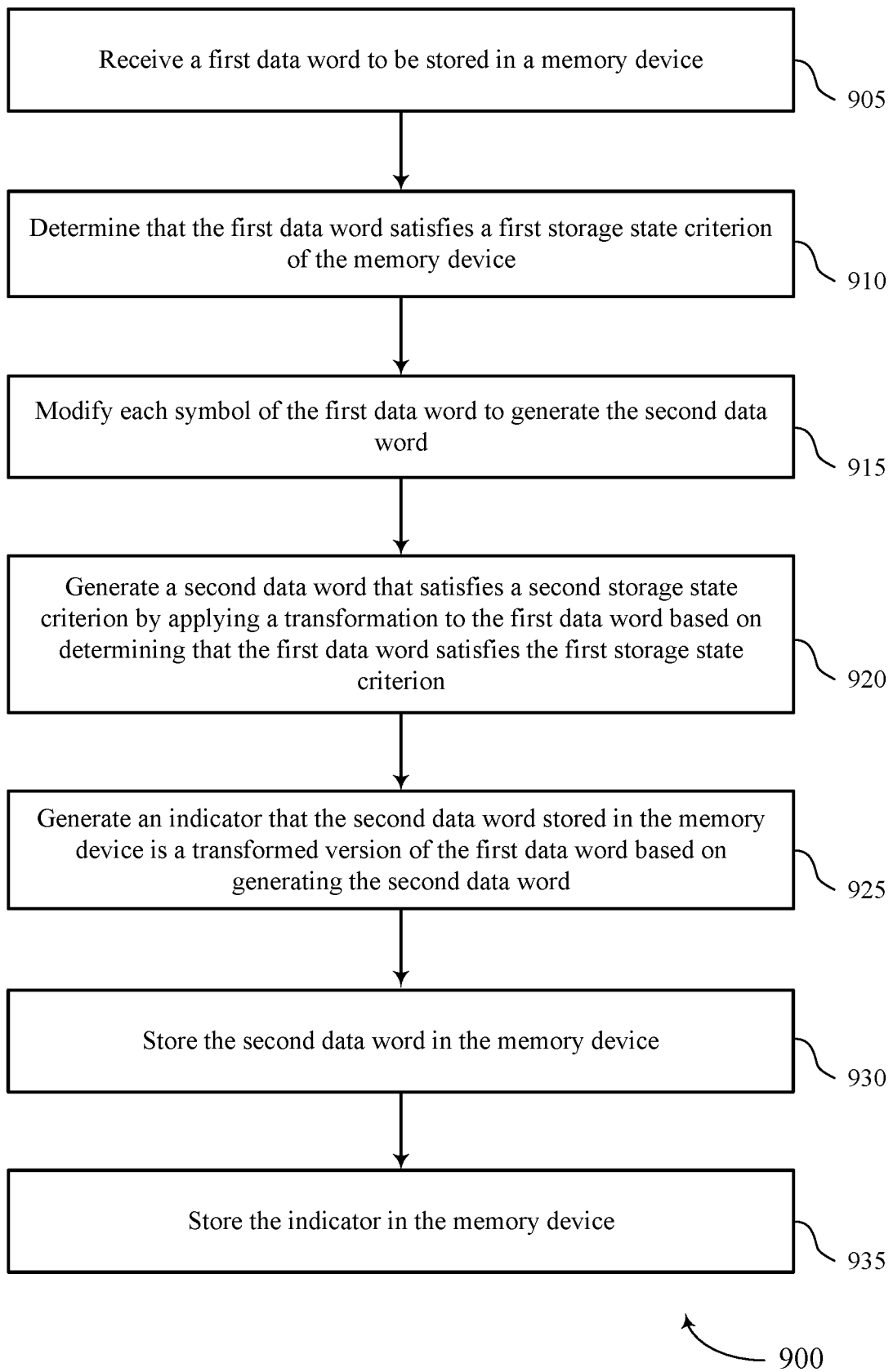

FIG. 9 shows a flowchart illustrating a method 900 that supports data storage based on data polarity in accordance with disclosed herein. The operations of method 900 may be implemented by a memory device or its components as described herein. For example, the operations of method 900 may be performed by a memory device as described with reference to FIGS. 1 through 4, 6, and 7. In some examples, a memory device may execute a set of instructions to control the functional elements of the memory device to perform the functions described below. Additionally or alternatively, a memory device may perform aspects of the functions described below using special-purpose hardware.

At 905, the memory device may receive, from a host device, a first data word to be stored in a memory device. The operations of 905 may be performed according to the methods described herein. In some examples, aspects of the operations of 905 may be performed by a memory device as described with reference to FIGS. 1 through 4, 6, and 7.

At 910, the memory device may determine, by the memory device, that the first data word satisfies a first storage state criterion of the memory device, the first storage state criterion indicating a first data retention characteristic of one or more memory cells of the memory device. The operations of 910 may be performed according to the methods described herein. In some examples, aspects of the operations of 910 may be performed by a memory device as described with reference to FIGS. 1 through 4, 6, and 7.

At 915, the memory device may modify each symbol of the first data word to generate the second data word, the first data word and the second data word each including three or more symbol types, where each symbol type of the first data word may be mapped to a different symbol type of the second data word. The operations of 915 may be performed according to the methods described herein. In some examples, aspects of the operations of 915 may be performed by a memory device as described with reference to FIGS. 1 through 4, 6, and 7.

At 920, the memory device may generate a second data word that satisfies a second storage state criterion by applying a transformation to the first data word based on determining that the first data word satisfies the first storage state criterion, the second storage state criterion indicating a second data retention characteristic of the one or more memory cells of the memory device. The operations of 920 may be performed according to the methods described herein. In some examples, aspects of the operations of 920 may be performed by a memory device as described with reference to FIGS. 1 through 4, 6, and 7.

At 925, the memory device may generate an indicator that the second data word stored in the memory device may be a transformed version of the first data word based on generating the second data word. The operations of 925 may be performed according to the methods described herein. In some examples, aspects of the operations of 925 may be performed by a memory device as described with reference to FIGS. 1 through 4, 6, and 7.

At 930, the memory device may store the second data word in the memory device. The operations of 930 may be performed according to the methods described herein. In some examples, aspects of the operations of 930 may be performed by a memory device as described with reference to FIGS. 1 through 4, 6, and 7.

At 935, the memory device may store the indicator in the memory device. The operations of 935 may be performed according to the methods described herein. In some examples, aspects of the operations of 935 may be performed by a memory device as described with reference to FIGS. 1 through 4, 6, and 7.

Figure 10:
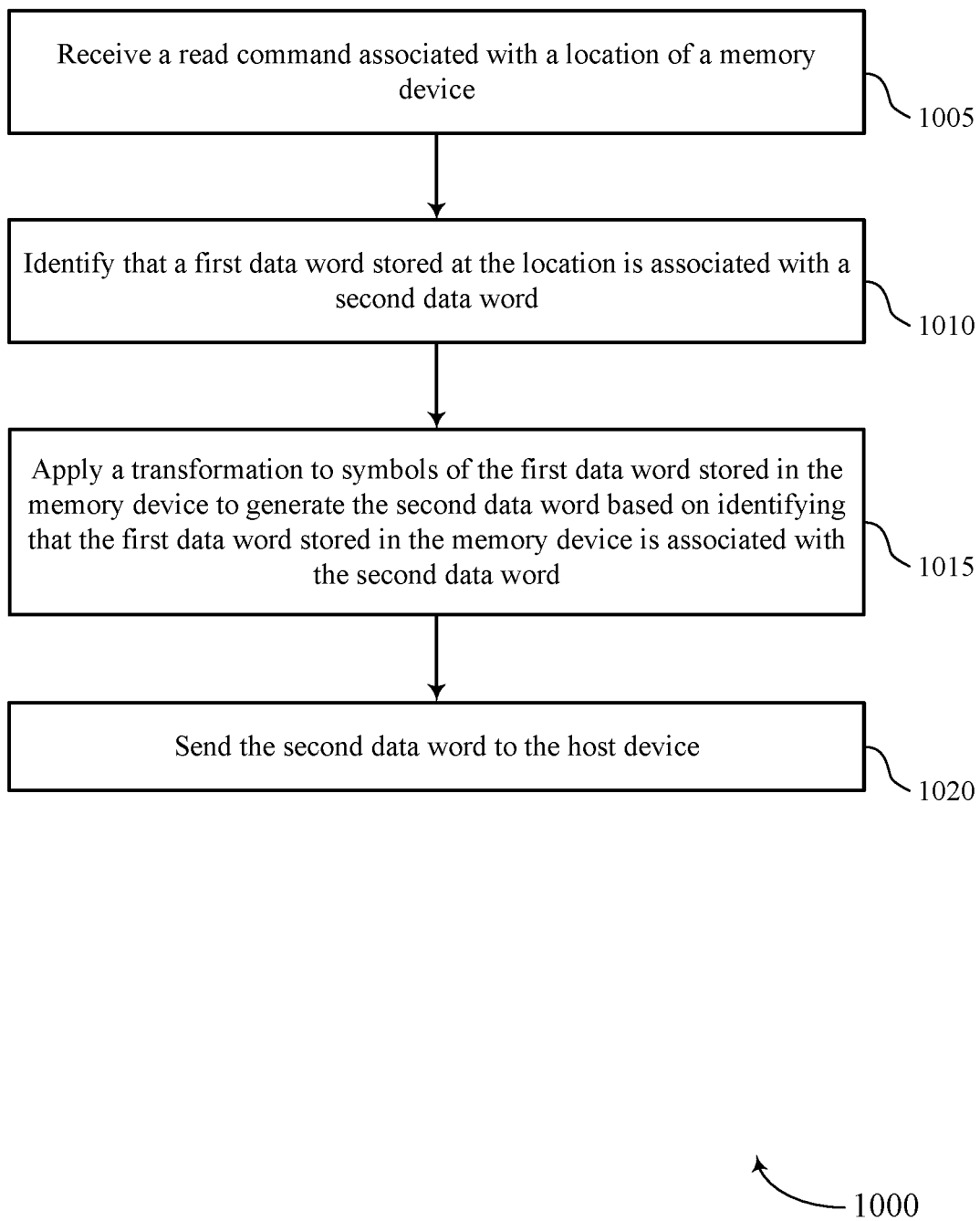

FIG. 10 shows a flowchart illustrating a method 1000 that supports data storage based on data polarity in accordance with disclosed herein. The operations of method 1000 may be implemented by a memory device or its components as described herein. For example, the operations of method 1000 may be performed by a memory device as described with reference to FIGS. 1 through 4, 6, and 7. In some examples, a memory device may execute a set of instructions to control the functional elements of the memory device to perform the functions described below. Additionally or alternatively, a memory device may perform aspects of the functions described below using special-purpose hardware.

At 1005, the memory device may receive, from a host device, a read command associated with a location of a memory device. The operations of 1005 may be performed according to the methods described herein. In some examples, aspects of the operations of 1005 may be performed by a memory device as described with reference to FIGS. 1 through 4, 6, and 7.

At 1010, the memory device may identify, by the memory device, that a first data word stored at the location may be associated with a second data word. The operations of 1010 may be performed according to the methods described herein. In some examples, aspects of the operations of 1010 may be performed by a memory device as described with reference to FIGS. 1 through 4, 6, and 7.

At 1015, the memory device may apply a transformation to symbols of the first data word stored in the memory device to generate the second data word based on identifying that the first data word stored in the memory device may be associated with the second data word. The operations of 1015 may be performed according to the methods described herein. In some examples, aspects of the operations of 1015 may be performed by a memory device as described with reference to FIGS. 1 through 4, 6, and 7.

At 1020, the memory device may send the second data word to the host device.

The operations of 1020 may be performed according to the methods described herein. In some examples, aspects of the operations of 1020 may be performed by a memory device as described with reference to FIGS. 1 through 4, 6, and 7.

Figure 11:
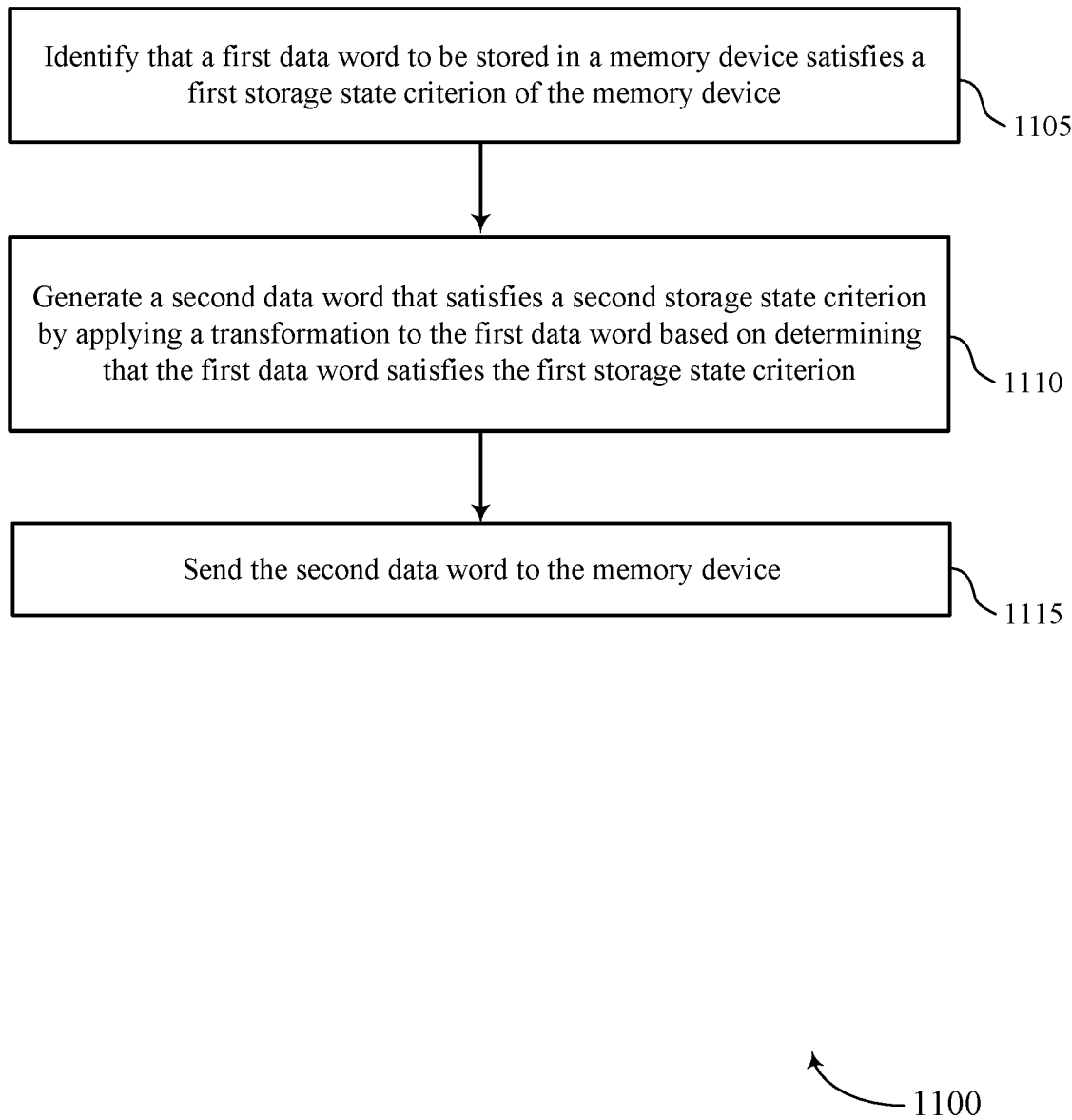

FIG. 11 shows a flowchart illustrating a method 1100 that supports data storage based on data polarity in accordance with disclosed herein. The operations of method 1100 may be implemented by a host device or its components as described herein. For example, the operations of method 1100 may be performed by a host device as described with reference to FIGS. 1, 2, and 5-7. In some examples, a host device may execute a set of instructions to control the functional elements of the host device to perform the functions described below. Additionally or alternatively, a host device may perform aspects of the functions described below using special-purpose hardware.

At 1105, the host device may identify, by a host device, that a first data word to be stored in a memory device satisfies a first storage state criterion of the memory device, the first storage state criterion indicating a first data retention characteristic of one or more memory cells of the memory device. The operations of 1105 may be performed according to the methods described herein. In some examples, aspects of the operations of 1105 may be performed by a host device as described with reference to FIGS. 1, 2, and 5-7.

At 1110, the host device may generate a second data word that satisfies a second storage state criterion by applying a transformation to the first data word based on determining that the first data word satisfies the first storage state criterion, a second data retention characteristic indicating a symbol type that may be configured to be stored in the one or more memory cells that exhibits less leakage compared to one or more symbol types configured to be stored in the one or more memory cells that are indicated by the first data retention characteristic. The operations of 1110 may be performed according to the methods described herein. In some examples, aspects of the operations of 1110 may be performed by a host device as described with reference to FIGS. 1, 2, and 5-7.

At 1115, the host device may send the second data word to the memory device.

The operations of 1115 may be performed according to the methods described herein. In some examples, aspects of the operations of 1115 may be performed by a host device as described with reference to FIGS. 1, 2, and 5-7.

It should be noted that the methods described above describe possible implementations, and that the operations and the steps may be rearranged or otherwise modified and that other implementations are possible. Further, aspects from two or more of the methods may be combined.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, or optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, or discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, or firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   a memory array;
   a receiving component configured to receive, from a host device, a storage state criterion request;
   a transmitting component configured to transmit, responsive to the storage state criterion request, a plurality of storage state criterions associated with the memory device;
   the receiving component configured to receive, from the host device, a data word that has satisfied a first storage state criterion and a second storage state criterion of the plurality of storage state criterions; and
   a storing component configured to store the data word in the memory device.

2. The memory device of claim 1, wherein:
   the receiving component is further configured to receive, from the host device, a read command associated with a location of the data word; and
   the transmitting component is further configured to transmit the data word based at least in part on the read command being exclusive of a transformation indicator.

3. The memory device of claim 1, wherein the first storage state criterion indicates a first storage state threshold indicating a maximum number of symbols of a symbol type associated with the first storage state criterion.

4. The memory device of claim 1, wherein the second storage state criterion indicates a second storage state threshold indicating a minimum number of symbols of a symbol type associated with the second storage state criterion.

5. The memory device of claim 1, wherein the data word is a transformation of information to be stored in the memory device, the transformation based at least in part on the information satisfying the first storage state criterion.

6. The memory device of claim 5, wherein each symbol of the data word is modified from each symbol of the information.

7. The memory device of claim 5, wherein the transformation comprises a data bit inversion.

8. An apparatus, comprising:
   a memory array;
   a controller coupled with the memory array and configured to cause the apparatus to:
      transmit, to a memory device, a command associated with an access operation;
      receive, from the memory device, a data word that has satisfied a first storage state criterion and a second storage state criterion, the first storage state criterion different from the second storage state criterion; and
      transform the data word based at least in part on the command.

9. The apparatus of claim 8, wherein the controller is further configured to cause the apparatus to:
   transmit the command exclusive of a transformation indicator.

10. The apparatus of claim 9, wherein the controller is further configured to cause the apparatus to:
determine that the command was transmitted exclusive of the transformation indicator, wherein the data word is transformed based at least in part on the determination.

11. The apparatus of claim 8, wherein the first storage state criterion is associated with a symbol type of a memory cell associated with higher data leakage or increased power consumption compared to one or more other symbol types.

12. An apparatus, comprising:
a memory array; and
a controller coupled with the memory array and configured to cause the apparatus to:
apply a transformation to a first data word to develop a second data word based at least in part on the first data word satisfying a first storage state criterion;
generate an indicator associated with the second data word, the indicator signaling that the second data word is a transformed version of the first data word; and
store the second data word and the indicator in the memory array.

13. The apparatus of claim 12, wherein the controller is further configured to cause the apparatus to:
determine that the first data word fails to satisfy a second storage state criterion, wherein the transformation is applied based at least in part on the determination.

14. The apparatus of claim 12, wherein the controller is further configured to cause the apparatus to:
determine that the second data word satisfies a second storage state criterion after the transformation, wherein storing the second data word is based at least in part on the determination.

15. The apparatus of claim 12, wherein the indicator signals how each symbol type of the first data word is modified as a part of the transformation.

16. The apparatus of claim 15, wherein the first data word and the second data word each comprise of three or more symbol types.

17. The apparatus of claim 15, wherein each symbol type of the first data word is mapped to a different symbol type of the second data word.

18. The apparatus of claim 12, wherein the indicator signals a type of transformation that has been applied.

19. The apparatus of claim 12, wherein the second data word is stored in a first portion of the memory array and the indicator is stored in a second portion of the memory array, the first portion of the memory array different than the second portion of the memory array.

20. The apparatus of claim 12, wherein the controller is further configured to cause the apparatus to:
receive, from a host device, a read command associated with a location of the second data word;
determining that the second data word has been transformed based at least in part on the indicator; and
transmitting the second data word based at least in part on the determination.

\* \* \* \* \*